Figure 1:
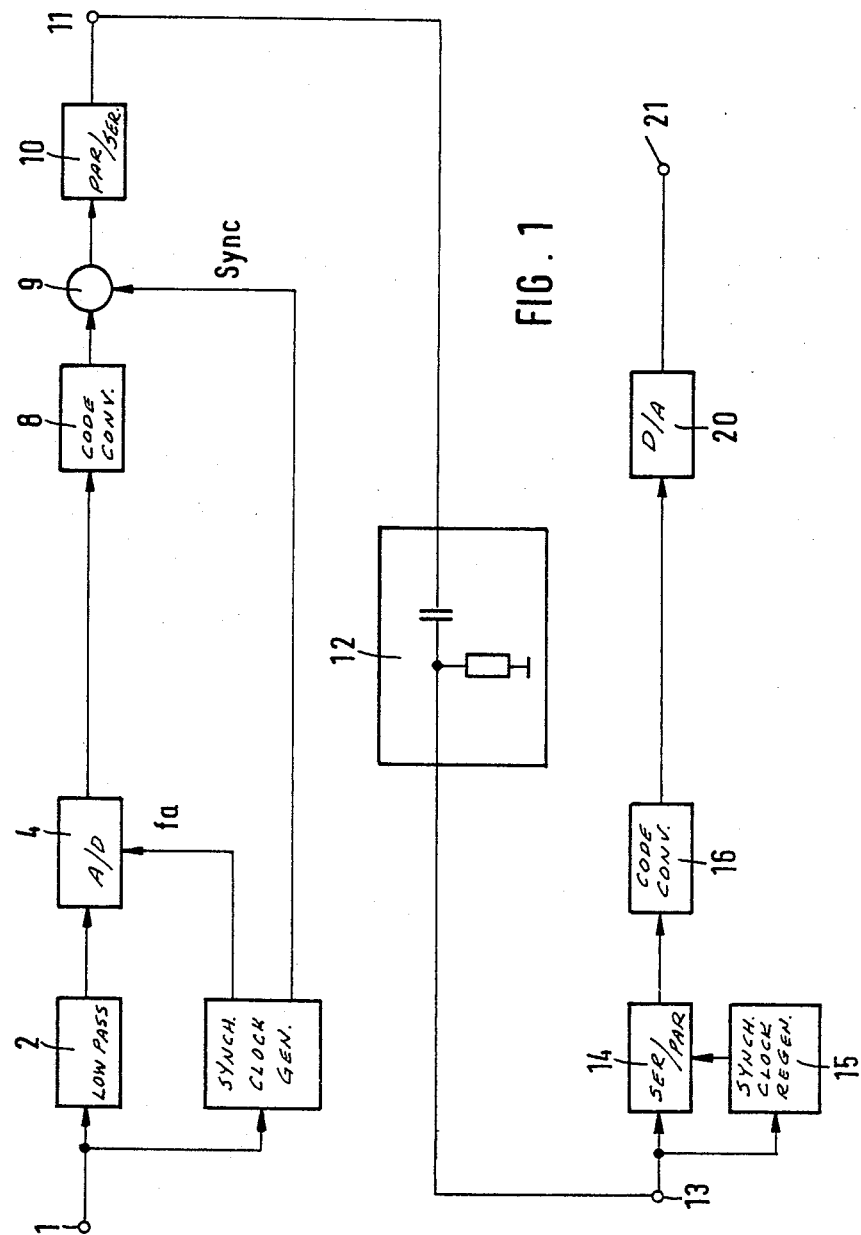

United States Patent [19]

Heitmann

[11] Patent Number: 4,792,794

[45] Date of Patent: Dec. 20, 1988

[54] DIFFERENTIAL PULSE CODE MODULATION SYSTEM WITH NEUTRALIZATION OF DIRECT CURRENT INFORMATION

[75] Inventor: Jürgen Heitmann, Alsbach-Hähnlein, Fed. Rep. of Germany

[73] Assignee: Robert Bosch GmbH, Fed. Rep. of Germany

[21] Appl. No.: 775,511

[22] PCT Filed: Dec. 8, 1984

[86] PCT No.: PCT/DE84/00267

§ 371 Date: Sep. 3, 1985

§ 102(e) Date: Sep. 3, 1985

[87] PCT Pub. No.: WO85/03177

PCT Pub. Date: Jul. 18, 1985

[51] Int. Cl.$^4$ .................. A03M 3/04; H04N 7/13
[52] U.S. Cl. .................. 341/143; 375/19; 375/27
[58] Field of Search .................. 360/39–43; 375/19, 27; 340/347 DD

[56] References Cited

U.S. PATENT DOCUMENTS 3,831,167 8/1974 Tewksbury .................. 340/347 DA
4,387,366 6/1983 Chow .................. 375/19 X
4,491,869 1/1985 Heitmann .................. 358/141
4,501,000 2/1985 Immink et al. .................. 375/106 X

OTHER PUBLICATIONS

The Engineering Staff of Analog Devices, Inc., Analog–Digital Conversion Handbook, 6/1972, pp. I-8, II-81.
National Semiconductor Data Sheet for MF6 6th Order Switched Capacitor Butterworth Lowpass Filter, 1983, 1 Sheet.
(Anonymous), Speech Signal Coding Handled by APCM, Electronics Weekly, 25 Jul. 1973, pp. 18 and 19.
Goldberg u.a.: "Optical Television Link Employing a Digitally Modulated Laser", Journal of the SMPTE, vol. 88, Jun. 1979, pp. 414–420.

Primary Examiner—T. J. Sloyan
Attorney, Agent, or Firm—Michael J. Striker

[57] ABSTRACT

A differential pulse code modulation system wherein digital code words assigned to the signal differences adjacent to the signal difference "Zero" have the same number of bits of one or the other logical level. In this manner, "d.c. voltage" information in the transmitted signal is neutralized.

13 Claims, 3 Drawing Sheets

| Decimal | Codeword |
|---|---|
| +115 | LLLL |
| +90 | LLLO |
| +64 | LLOL |
| +38 | LOLL |
| +15 | OLLL |
| +4 | OLLO |
| +1 | OOLL |
| 0 | OLOL |
| -1 | LLOO |
| -4 | LOOL |
| -15 | LOOO |
| -38 | OLOO |
| -64 | OOLO |
| -90 | OOOL |
| -115 | OOOO |
| Syncword: | LOLO |

| Decimal | Codeword |
|---|---|
| + 115 | L L L L |
| + 90 | L L L 0 |
| + 64 | L L 0 L |
| + 38 | L 0 L L |
| + 15 | 0 L L L |
| + 4 | 0 L L 0 |
| + 1 | 0 0 L L |
| 0 | 0 L 0 L |
| − 1 | L L 0 0 |
| − 4 | L 0 0 L |
| − 15 | L 0 0 0 |
| − 38 | 0 L 0 0 |
| − 64 | 0 0 L 0 |
| − 90 | 0 0 0 L |
| − 115 | 0 0 0 0 |
| Syncword: | L 0 L 0 |

FIG. 2

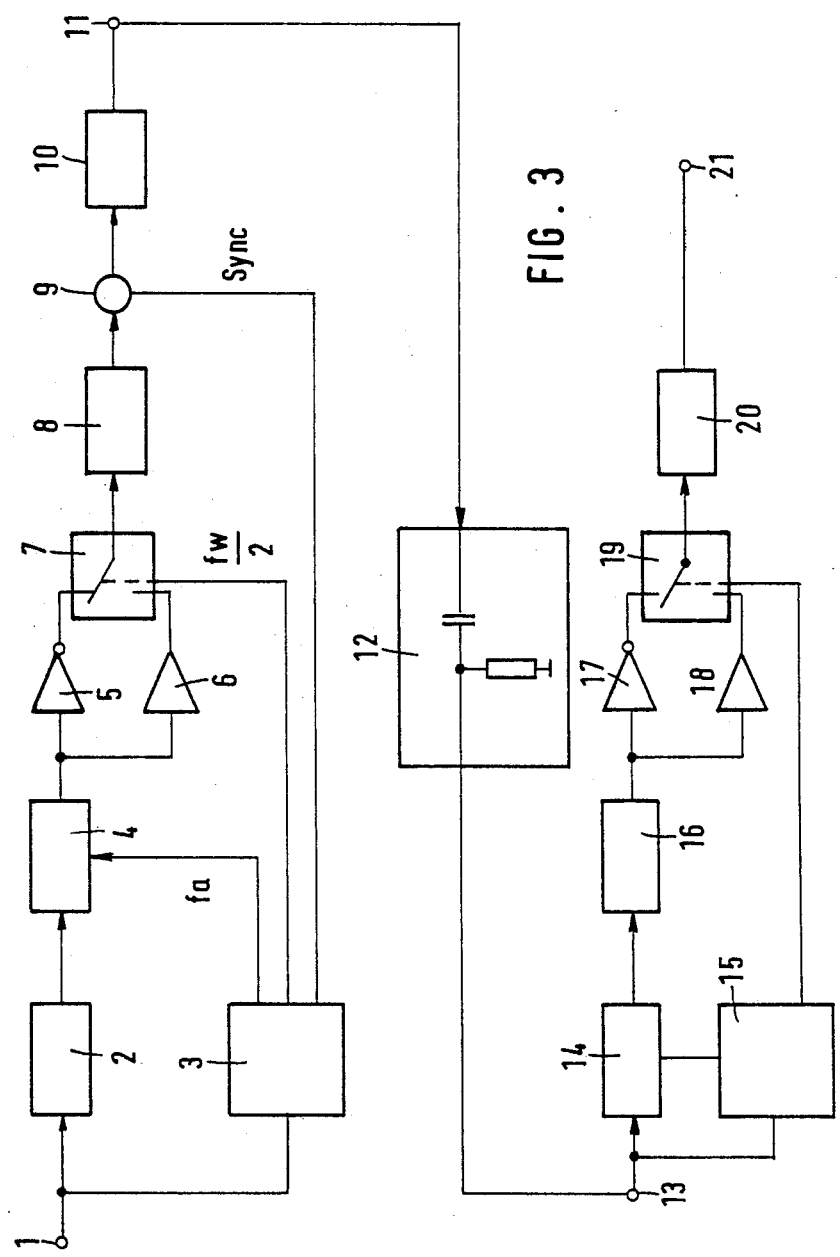

DIFFERENTIAL PULSE CODE MODULATION SYSTEM WITH NEUTRALIZATION OF DIRECT CURRENT INFORMATION

STATE OF THE ART

The invention is based on a system in accordance with the type of the main claim. During the magnetic recording of digitally coded electrical signals, low frequency portions or direct voltage components of the digital signals can very often not be recorded or reproduced at all or only at a very limited scope. Therefore, codes are desired which result in digital signals not containing any direct current components. Such codes may also be required for transmitting of digital signals through a transmitting channel which has a high pass filter characteristic, that is a low cutoff frequency limit.

A simple means to obtain freedom from the d.c. components consists in adding a number of bits to each given signal segment, for example, each data word, at such a logic level that the bits of the L and H levels cancel out with each other for the total signal segment. However, this trivial possibility is impractical, since in most of the cases the channel capacity is limited and consequently, redundancy in transmission should be minimized.

A process for transmitting of digitally coded signals is known from U.S. Pat. No. 4,310,860, wherein a given data sequence is separated into sequences with or without a direct current component and that the sequences with the direct current component are replaced by sequences without direct current components. However, thereby it is also required to make available an additional channel capacity for the replacement signal.

In a further known process (Goldberg u.a.: Optical Television Link Employing a Digital Modulated Laser", Journal of the SMPTE, Vol. 88, June 1979, page 414 etc) the digital signal is inverted from scanning value to scanning value. However, this process provided satisfactory results only for certain contents of the signal to be transmitted.

From U.S. Pat. No. 4,491,869, which is based on a previous patent application of applicant, a pulse code modulation system for digital signals is known wherein the signals are fed through a recording or transmission channel with a high pass characteristic. Therein, the band width of the analog signal on which the digital signal is based are limited to such an extent that the highest contained frequencies in the band limited analog signal are smaller than half of the scanning frequency and that the digital signal inverts from scanning to scanning. Thereby, the digital signal is based on a code, wherein within a digital word the number of bits of respective logical levels has a somewhat linear dependency on the given value of the analog signal. By this coding the mean value per digital data word is a substantially linear function of the analog level, so that after the inversion the serial data signal itself does not contain any direct voltage component.

It is an object of the invention to suggest a differential pulse code modulation system, wherein a substantially direct current free digitial signal is generated depending on the signal content, without adding an additional redundancy.

ADVANTAGES OF THE INVENTION

The system in accordance with the invention with the characterizing features of the main claim has the advantage that the digital signals coded in dependency on the signal contents are substantially free from direct current components and that no additional redundancy has to be added.

The system in accordance with the invention may be used in the particularly advantageous manner for recording or transmission of video signals, but also other analog signals, for example, audio signals.

DRAWING

Exemplified embodiments of the invention are illustrated in the drawing and explained in more detailed in the following description. The drawing shows:

FIG. 1 a block diagram of a first embodiment of a device for coding and decoding in accordance with the inventive system, FIG. 2 in a tabulated form an example for a code being useable in the system in accordance with the invention, FIG. 3 a block diagram of another embodiment of a device for coding and decoding.

DESCRIPTION OF THE INVENTION

FIG. 1 illustrates one exemplified embodiment of the invention. The videosignal to be recorded is fed at 1. It is fed to a low pass 2 and to an analog-digital-converter 4, on the one hand, and to a synchronous clock generator 3, on the other hand. Therein, the synchronisation signal sync is separated from the video signal $f_a$, from which the scanning or sampling cycle for the analog-digital-converter 4 and further cycle signals, which will be explained later, are derived. The digital output signal of an analog-digital-converter consists generally of a multi digit binary word which starts at the lowest video level with 0000, for example, and has the value 1111 at the highest video level. For achieving a sufficiently high definition of the level stages of the video signal an 8-digit word is mostly transmitted. A digital code signal is generated in a code converter 8 from the binary-coded output signal of the analog-digital converter 4. The converted code is such that within one word the number of bits of a logical level has a substantially linear dependency on the given value of the analog signal and wherein only one or two bits of one each word change from level change stage to level change stage of the analog signal. Consequently, the digital words which are assigned to no level changes or only minor level changes always have a uniform number of bits of the one or the other logical level. Therefore, they are free of direct voltage. With increasing magnitude of the level change in one direction the number of bits of one logical level is greater, and with increasing change in the other direction the number of bits of the other logical level is greater. In a 4-bit digital word in the NRZ-code the codes 1010, 1001, 0011, 0110, 0101 are free from direct voltage and are used to identify small level jumps in the analog signal and the level change "Zero". The digital code word 1010, which is also free from direct voltage, may be reversed for the regularly appearing synchronous signal. The aforedescribed distribution of the direct voltage free digital words should be considered as an example, any other combination of the direct voltage free digital words is equally applicable. But also outside of the range represented by the direct voltage free digital words, the principle of the adapted spectral energy distribution is maintained, since from large negative signal differences through the difference zero up to large positive signal differences and amount of bits of a logical level decreases from a numerical majority to the number zero and the number of bits of the other logical level increases from zero to the maximum number.

Since in each television image the complete saturation or desaturation in one direction is achieved after a number of level jumps, level changes must of necessity follow in the other direction. Therefore, in the given coding, digital words with a majority of bits of one logical level follow words with a majority of bits of the other logical level. Therefore, the transmitted signal is direct voltage free in its mean value. The code inverter 8 may consist of a programmable read only storage (PROM).

FIG. 2 illustrates a table from which it can be seen that within a defined level change range of the analog signal (decimal values) the level changes are represented by digital code words with a same number of bits of the one or the other logical level. The digital code words adjacent to the analog signal difference "Zero" have the same number of bits of opposite logical level whereby corresponding bits in the two adjacent code words are inverted.

A digital synchronous signal sync which had been derived from the synchronizing signal of the video signal in generator 3, is added to the digital code signal in circuit 9. The parallel/serial converter 10 finally converts the digital code signal into a serial digital signal which is fed to the schematically illustrated recording device or to a transmission channel 12 with a high-pass characteristic.

The reproduced or transmitted serial digital code signal is fed at 13 (FIG. 1) to a series-to-parallel converter 14 and to a synchronous clock regenerator 15. The output signal is fed to a code converter 16, whose function is opposite to the function of the code converter 8, so that a binary coded signal is available at its output, as described above.

Finally, the analog video signal is generated with the assistance of a digital-analog-converter 20 which is available at the output 21 for further use.

The individual circuits which are schematically illustrated as blocks correspond basically to known circuits and therefore do not have to be explained in detail within the framework of the subject invention.

The aforedescribed coding results in that the majority of the video image areas are almost exclusively represented by DPCM-words which in the ZNR-code have the same number of bits of the one and the other logical level, as far as the digital code words have an even number of bits. When coding in a code with an uneven number of bits in each digital word, an alternating inversion of the digital words is required in order to balance the available numerical majority of a logical level in transmitted video image areas. The block circuit diagram in accordance with FIG. 3 is provided with a switch device for a wordwise inverting for the coding as well as decoding. The circuit elements with the same function or which are identical with the circuit elements of FIG. 1 are designated by the same reference numerals and do not have to be explained again. In order to invert each second digital word, a signal, $fw_2$ with a half word frequency is fed from the synchronous clock generator 3 to a switch 7. The switch 7 feeds the digital signal to a code converter 8 during a word period, whereby the digital signal is fed simultaneously through an inverter 5 and through a buffer 6. The output signal of the series parallel converter 14 is fed to a code converter 16, whose function is opposite to the function of the code converter 8, so that a binary-coded signal is available on its output, as described before. This in turn is inverted from digital word to digital word with the assistance of the inverting and buffer circuits 17, 18 and switch 19, whereby the invertion in corresponding circuits 5, 6 and 7 is cancelled. For this purpose, a signal with a half word frequency $fw_2$ is fed from the synchronous clock regenerator 15 to switch 19. Finally, with the assistance of the digital-analog-converter 20 the analog video signal is generated which is available for further use at output 21.

I claim:

1. Differential pulse code modulation system, wherein an analog signal is converted into binary digital words of a constant length and the digital words are fed through a recording or transmission channel with a high-pass characteristic, the band-width of the analog signal being limited to such an extent that the highest frequency of the analog signal is smaller than half of the sampling frequency which is used for the analog-digital conversion, comprising code converting means for providing digital words which pertain to the analog signal difference "Zero" and to a range of relatively small positive and negative signal differences adjacent to the signal difference "Zero", with the same number of "0" bits and "1" bits, while the digital words pertaining to the remaining signal differences in a given range of the analog signal include an unequal number of "0" bits and "1" bits, the order of minority bits in consecutive positive and negative digital words changing substantially linearly with the values of the remaining analog signal differences, and the positive and negative digital words having the same absolute value being complementary.

2. System in accordance with claim 1, wherein a digital low pass is provided subsequent to an analog-digital-converter.

3. Decoding system in accordance with claim 1, wherein corresponding bits in the respective adjacent digital words are inverted.

4. System in accordance with claim 1, wherein the analog signal is band limited before the analog-digital-conversion.

5. System in accordance with claim 1 wherein the number of equivalent bits in said remaining range of analog signal differences changes by one with the change of a quantized value of the analog signal to the next quantized value.

6. Decoding system in accordance with claim 4, wherein the digital signal which had been picked up from the output of the recording or transmitting channel is fed to a series-parallel-converter and to a synchronous clock generator and the output of the series-parallel-converter is connected with the input of a code converter, whose output signal is fed to a digital-analog-converter.

7. Coding system in accordance with claim 4, wherein the analog signal is fed to a low pass, the output of the low pass is connected with the input of an analog-digital-converter at the output of which a binary word is available which is fed to a code converter, and the output signal of the code converter together with a synchronous signal, which had been generated by a synchronous clock generator, are fed to a parallel-series-converter.

8. Coding system in accordance with claim 7, wherein the digital signal is in binary shape at the output of the analog-digital-converter and is inverted from digital word to digital word with the assistance of a controllable inverter circuit.

9. Coding system in accordance with claim 7, wherein the analog signal is a video signal.

10. Coding system in accordance with claim 7, wherein the analog signal is an audio signal.

11. Decoding system in accordance with claim 6, wherein the analog signal is a video signal.

12. Decoding system in accordance with claim 6, wherein the analog signal is an audio signal.

13. Decoding system in accordance with claim 6, wherein the output signal of the code converter is fed through a word by word reversible inverter circuit to a digital-analog-converter.

* * * * *